United States Patent
Park et al.

(10) Patent No.: US 8,582,360 B2
(45) Date of Patent: Nov. 12, 2013

(54) READ METHOD FOR NONVOLATILE MEMORY DEVICE, AND DATA STORAGE SYSTEM USING THE SAME

(75) Inventors: Min Gun Park, Yongin-si (KR); Ki Tae Park, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 207 days.

(21) Appl. No.: 13/070,347

(22) Filed: Mar. 23, 2011

(65) Prior Publication Data

US 2011/0235415 A1   Sep. 29, 2011

(30) Foreign Application Priority Data

Mar. 29, 2010 (KR) .................. 10-2010-0028008

(51) Int. Cl.
*G11C 11/34* (2006.01)
(52) U.S. Cl.
USPC ............. 365/185.09; 365/185.24; 365/189.09
(58) Field of Classification Search
USPC .................. 365/185.09, 185.24, 189.09, 235, 365/189.04, 185.33, 163, 158, 171, 185.17, 365/185.18
See application file for complete search history.

(56) References Cited

U.S. PATENT DOCUMENTS

| | | | |
|---|---|---|---|
| 6,377,491 B2 | 4/2002 | Otani et al. | |
| 6,858,906 B2 | 2/2005 | Lee et al. | |
| 7,061,812 B2 | 6/2006 | Shinagawa et al. | |
| 7,529,124 B2 | 5/2009 | Cho et al. | |
| 7,542,350 B2 * | 6/2009 | Park et al. | 365/185.24 |
| 7,623,366 B2 | 11/2009 | Park et al. | |
| 8,036,031 B2 | 10/2011 | Park et al. | |
| 2004/0169238 A1 | 9/2004 | Lee et al. | |
| 2006/0180851 A1 | 8/2006 | Lee et al. | |
| 2008/0023747 A1 | 1/2008 | Park et al. | |
| 2008/0084729 A1 | 4/2008 | Cho et al. | |
| 2008/0320366 A1 * | 12/2008 | Lin | 714/763 |
| 2009/0172481 A1 * | 7/2009 | Cornwell et al. | 714/721 |
| 2009/0177931 A1 | 7/2009 | Song et al. | |
| 2009/0234792 A1 | 9/2009 | Kim et al. | |
| 2009/0235129 A1 | 9/2009 | Eun et al. | |
| 2010/0199138 A1 * | 8/2010 | Rho | 714/746 |
| 2011/0280066 A1 | 11/2011 | Park et al. | |

FOREIGN PATENT DOCUMENTS

| | | |
|---|---|---|
| JP | 2001-250388 | 9/2001 |
| JP | 2004-310477 | 11/2004 |
| KR | 10-2001-0100793 A | 11/2001 |
| KR | 10-2004-0087916 A | 10/2004 |
| KR | 10-0673020 | 1/2007 |
| KR | 10-2009-0046568 A | 5/2009 |
| KR | 10-2009-0075101 A | 7/2009 |
| KR | 10-2009-0097672 A | 9/2009 |
| KR | 10-2009-0099265 A | 9/2009 |

* cited by examiner

*Primary Examiner* — Dang Nguyen
(74) *Attorney, Agent, or Firm* — Muir Patent Consulting, PLLC

(57) ABSTRACT

Provided is a method for reading data from a nonvolatile memory device. In the method, a read method includes a first read step including reading a first memory cell of the nonvolatile memory device by applying a first set of read voltages to the first memory cell. The read method further includes a second read step including reading the first memory cell by applying a second set of read voltages and none of the voltages in the first set to the first memory cell when it is determined that the first read step results in an error and cannot be corrected with error correction. The second read step is performed by using data resulting from the first read step.

14 Claims, 11 Drawing Sheets

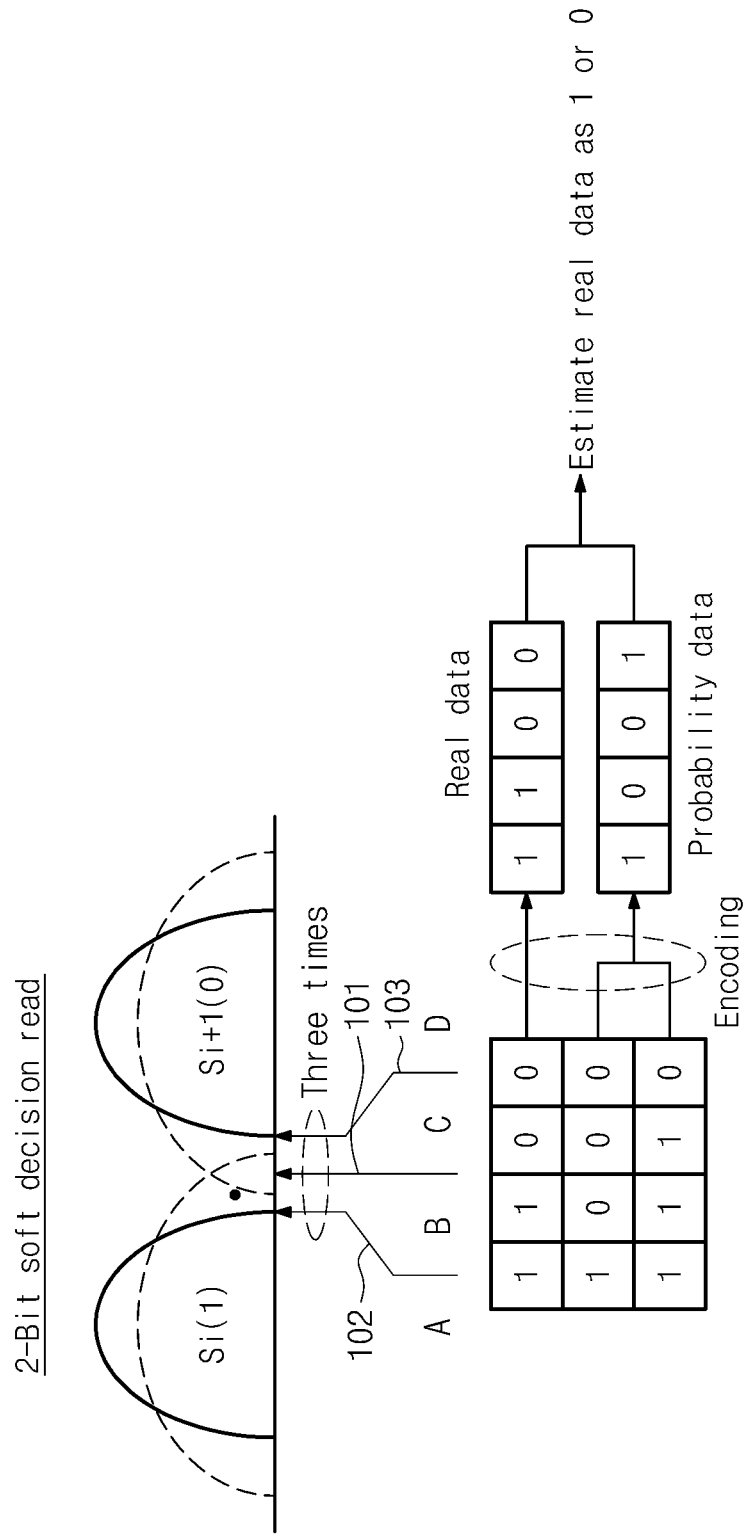

READ METHOD FOR NONVOLATILE MEMORY DEVICE, AND DATA STORAGE SYSTEM USING THE SAME

CROSS-REFERENCE TO RELATED APPLICATIONS

This U.S. non-provisional patent application claims priority under 35 U.S.C. §119 to Korean Patent Application No. 10-2010-0028008, filed on Mar. 29, 2010, the entire contents of which are hereby incorporated by reference.

BACKGROUND

The present disclosure relates to electronic devices, and more particularly, to data storage systems.

Semiconductor memory devices are microelectronic devices that are used to design digital logic circuits such as microprocessor-based applications and computers for the fields ranging from satellite to consumer electronics. Therefore, an advance in memory fabrication technology, including technology development and process improvement obtained through scaling for high speed and high integration density, assists in establishing the performance standards of other digital logic systems.

Semiconductor memory devices are generally classified into volatile memory devices and nonvolatile memory devices. Examples of the volatile memory devices include static random-access memory (SRAM) devices and dynamic random-access memory (DRAM) devices. The SRAM devices store logic information by setting the logic state of a bistable flip-flop, and the DRAM devices store logic information by charging a capacitor. The volatile memory devices store and read data in a power-on state, but lose the stored data in a power-off state.

Examples of the nonvolatile memory devices include magnetic read-only memory (MROM) devices, programmable read-only memory (PROM) devices, erasable programmable read-only memory (EPROM) devices, electrically erasable programmable read-only memory (EEPROM) devices, and flash memory devices. The nonvolatile memory devices can retain data stored therein even when power supply thereto is interrupted. The state of data stored in the nonvolatile memory devices may be permanent or reprogrammable according to memory fabrication technologies. The nonvolatile memory devices are used to store programs and microcodes in various applications such as computers, avionics, communications, and consumer electronic technologies. A combination of volatile and nonvolatile memory storage modes in a single chip may also be used in devices such as nonvolatile RAMs (nvRAMs) in a system that requires quick and reprogrammable nonvolatile memories. In addition, specific memory structures including some additional logic circuits have been developed to optimize the performance for application-oriented tasks.

Since nonvolatile memory devices such as MROM devices, PROM devices and EPROM devices are not allowed to erase and write, it is not easy for general users to update data stored in such nonvolatile memory devices. On the other hand, since nonvolatile memory devices such as EEPROM devices and flash memory devices are electrically erasable and programmable, their applications are expanding to auxiliary memory devices or system programming that require continuous data update.

SUMMARY

The present disclosure provides a nonvolatile memory device, a data storage system and a read method thereof, which can improve a read performance.

According to one embodiment, a read method for a nonvolatile memory device is disclosed. The read method includes a first read step including reading a first memory cell of the nonvolatile memory device by applying a first set of read voltages to the first memory cell. The read method further includes a second read step including reading the first memory cell by applying a second set of read voltages and none of the voltages in the first set to the first memory cell when it is determined that the first read step results in an error and cannot be corrected with error correction. The second read step is performed by using data resulting from the first read step.

In further embodiment, a read method for a nonvolatile memory device is disclosed. The read method includes a hard decision read step including reading a first memory cell of the nonvolatile memory device by applying a first voltage to the first memory cell. The read method further includes a first soft decision read step including reading the first memory cell by applying a first set of read voltages to the first memory cell when it is determined that the hard decision read step results in an error and cannot be corrected with error correction. The read method additionally includes a second soft decision read step including reading the first memory cell by applying a second set of read voltages and none of the voltages in the first set to the first memory cell when it is determined that the first soft decision read step results in an error and cannot be corrected with error correction. The second soft decision read step is performed by using data resulting from the first soft decision read step.

In another embodiment, a nonvolatile memory device is disclosed. The nonvolatile memory device includes a plurality of memory cells and a control circuit. The plurality of memory cells are arranged in rows and columns. The control circuit is configured to perform a hard decision read step, a first soft decision read step and a second soft decision read step. The hard decision read step includes reading a first memory cell of the plurality of memory cells by applying a first voltage to the first memory cell. The first soft decision read step includes reading the first memory cell by applying a first set of read voltages to the first memory cell when it is determined that the hard decision read step results in an error and cannot be corrected with error correction. The second soft decision read step includes reading the first memory cell by applying a second set of read voltages and none of the voltages in the first set to the first memory cell when it is determined that the first soft decision read step results in an error and cannot be corrected with error correction. The second soft decision read step further includes using the data resulting from the first soft decision read step.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 5 is a diagram illustrating a typical 2-bit soft decision read method;

DETAILED DESCRIPTION OF THE EMBODIMENTS

Figure 1:
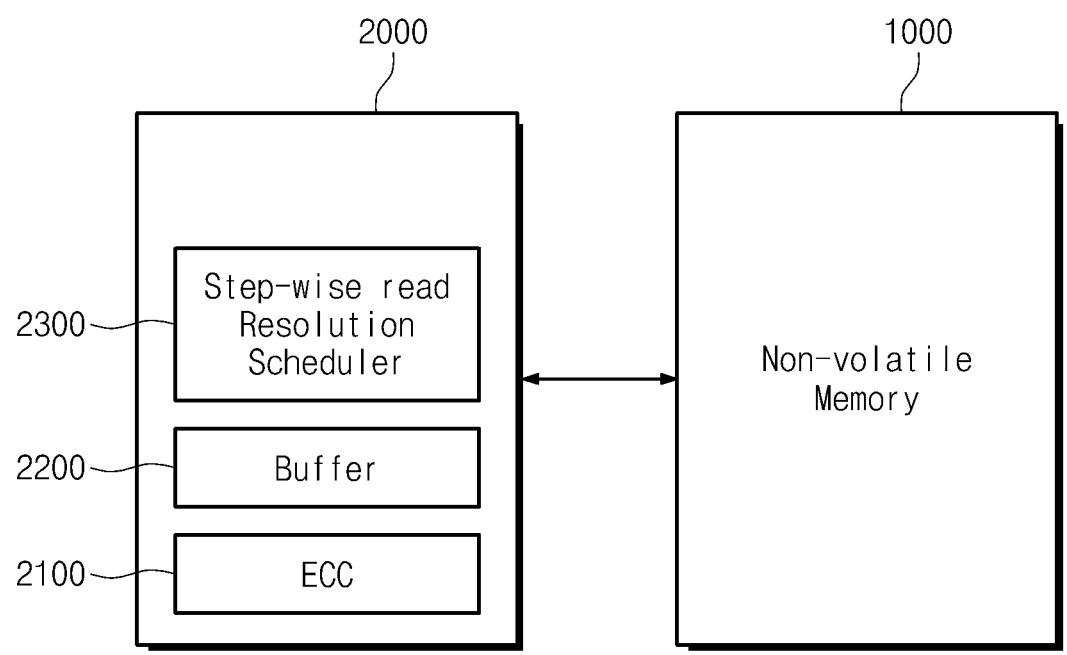
FIG. 1 is a block diagram of a data storage system according to an exemplary embodiment.

Exemplary embodiments of the inventive concept will be described below in more detail with reference to the accompanying drawings. Advantages and features of the inventive concept, and implementation methods thereof will be clarified through the following embodiments described with reference to the accompanying drawings. The inventive concept may, however, be embodied in different forms and should not be construed as limited to the embodiments set forth herein.

In the drawings, exemplary embodiments of the inventive concept are exaggerated for clarity of illustration and are not limited to illustrated specific shapes. Throughout the specification and drawings, like reference numerals denote like elements.

As used herein, the term "and/or" includes any and all combinations of one or more of the associated listed items. Also, when one part (or element, device, etc.) is referred to as being "connected/coupled" to another part (or element, device, etc.), it should be understood that the former may be "directly connected" to the latter, or "indirectly connected" to the latter through at least one intervening part (or element, device, etc.). The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Hereinafter, exemplary embodiments will be described in detail with reference to the accompanying drawings.

FIG. 1 is a block diagram of a data storage system according to an exemplary embodiment.

Referring to FIG. 1, a data storage system according to an exemplary embodiment includes one or more nonvolatile memory devices 1000 and a memory controller 2000. Nonvolatile memory device 1000 may comprise, for example, a chip or stack of chips. For convenience's sake, FIG. 1 illustrates only one nonvolatile memory device 1000. As a storage medium, the nonvolatile memory device 1000 operates in response to the control of the memory controller 2000 and is used to store multi-bit (or multi-level) data. For example, the nonvolatile memory device 1000 is configured to store M-bit data (M: an integer equal to or greater than 2) in each memory cell.

The memory controller 2000 controls the nonvolatile memory device 1000 in response to the request from an external device (e.g., a host). The memory controller 2000 includes an error correction code (ECC) unit 2100 that generates ECC data (or ECC parity data) on the basis of data to be stored in the nonvolatile memory device 1000 and detects/corrects an error in data read from the nonvolatile memory device 1000. For example, an error correction capability of the ECC unit 2100 is determined on the basis of the number of data bits stored in each memory cell. For example, the error correction capability depends on storage regions (e.g., a meta region, a code region, and a user region) of the nonvolatile memory device 1000 and wear-leveling information of the nonvolatile memory device 1000. The ECC unit 2100 may be implemented in software, hardware or a combination thereof. The nonvolatile memory device may include the ECC unit 2100. The memory controller 2000 further includes a buffer memory 2200 for temporarily storing data read from the nonvolatile memory device 1000. The buffer memory 2200 may additionally be used to temporarily store data received from an external device (e.g., a host).

The memory controller 2000 further includes a stepwise read resolution scheduler 2300 (hereinafter referred to simply as 'scheduler'). The scheduler 2300 controls the nonvolatile memory device 1000 in response to an external request (e.g., a data read operation). For example, when an error in data read from the nonvolatile memory device 1000 is determined to be uncorrectable using typical ECC methods, that is, when an error in data read by a normal read operation (or a hard decision read operation) is determined to be uncorrectable, the scheduler 2300 enables one of soft decision read operations with different read resolutions (e.g., different number of read voltages applied to memory cell(s) to determine the memory cell(s) data). Herein, the read resolutions of the soft decision read operations increase in ascending order. For example, the first-selected soft decision read operation has the lowest read resolution and the last-selected soft decision read operation has the highest read resolution. An increase in the read resolution causes an increase in the read/sense count. In particular, even if all or some of the soft decision read operations with different read resolutions are sequentially enabled, the memory controller 2000 may restrict the total read time (i.e., the time taken to perform soft decision read operations and/or hard decision read operations) by the read time necessary for the last-selected soft decision read operation.

In an exemplary embodiment, the scheduler 2300 may include a processing unit and a ROM (or the like) that stores software (or firmware) executed by the processing unit.

Figure 2:
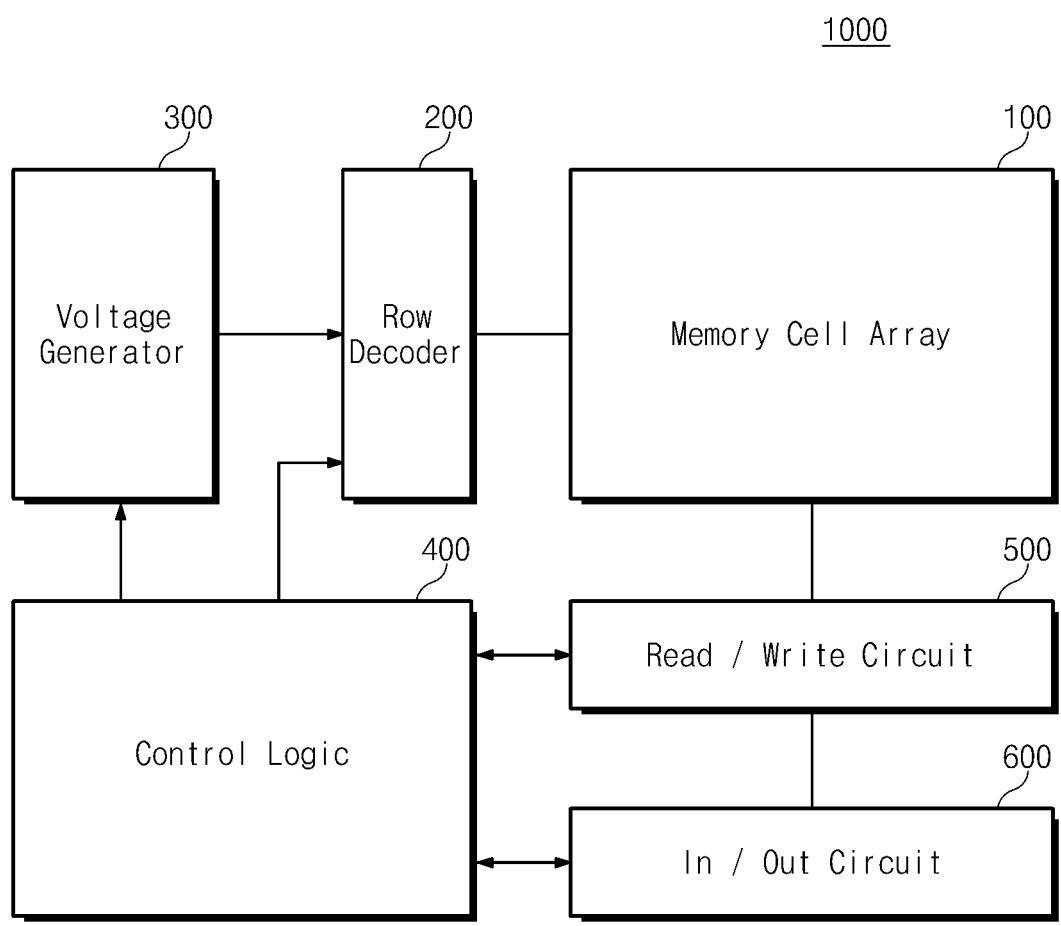
FIG. 2 is a block diagram of a nonvolatile memory device according to an exemplary embodiment.

FIG. 2 is a block diagram of a nonvolatile memory device according to an exemplary embodiment.

Referring to FIG. 2, the nonvolatile memory device 1000 may be, for example, a NAND flash memory device. However, it will be well understood that the nonvolatile memory device 1000 is not limited to a NAND flash memory device. The nonvolatile memory device 1000 includes a memory cell array 100 having memory cells arranged in rows (word lines WL) and columns (bit lines BL). Each memory cell stores 1-bit data or M-bit data (M: an integer equal to or greater than 2). Each memory cell may be implemented using a memory cell with a charge storage layer such as a charge trap layer or a floating gate, a memory cell with a variable resistor, or the like. The memory cell array 100 may be configured to have a single-layer array structure (e.g., a two-dimensional array structure) or a multi-layer array structure (e.g., a three-dimensional array structure). Examples of the three-dimensional array structure are disclosed in U.S. Patent Application Publication No. 2008/0023747 titled "SEMICONDUCTOR MEMORY DEVICE WITH MEMORY CELLS ON MULTIPLE LAYERS" and U.S. Patent Application Publication No. 2008/0084729 titled "SEMICONDUCTOR DEVICE WITH THREE-DIMENSIONAL ARRAY STRUCTURE", the entirety of which are hereby incorporated by reference.

A row decoder 200 is configured to select/drive the rows of the memory cell array 100. A voltage generator 300 is controlled by a control logic 400 and is configured to generate voltages for program/erase/read operations (e.g., a program voltage, a pass voltage, an erase voltage, and a read voltage). The control logic 400 is configured to control an overall operation of the nonvolatile memory device 1000. The control logic 400 is configured to control a hard decision read operation (or a normal read operation) or a soft decision read operation according to the control of the memory controller 2000 of FIG. 1. A read/write circuit 500 is controlled by the control logic 400 and operates as a sense amplifier or a write driver according to a mode of operation. For example, in a read operation, the read/write circuit 500 operates as a sense amplifier that senses data from memory cells (or selected memory cells) of a selected row. The read data are provided through an input/output (I/O) circuit 600 to an external device on a predetermined I/O unit. In a program operation, the read/write circuit 500 operates as a write driver that drives memory cells of a selected row according to program data. The read/write circuit 500 includes page buffers corresponding respectively to bit lines or bit line pairs. If each of the memory cells stores multi-bit/multi-level data, each page buffer of the read/write circuit 500 is configured to have a plurality of latches. In another exemplary embodiment, each page buffer of the read/write circuit 500 may be configured to have a plurality of latches that perform a logic function (e.g., an XNOR function) according to the control of the control logic 400. The I/O circuit 600 is configured to interface with an external device (e.g., the memory controller 2000).

Figure 3:
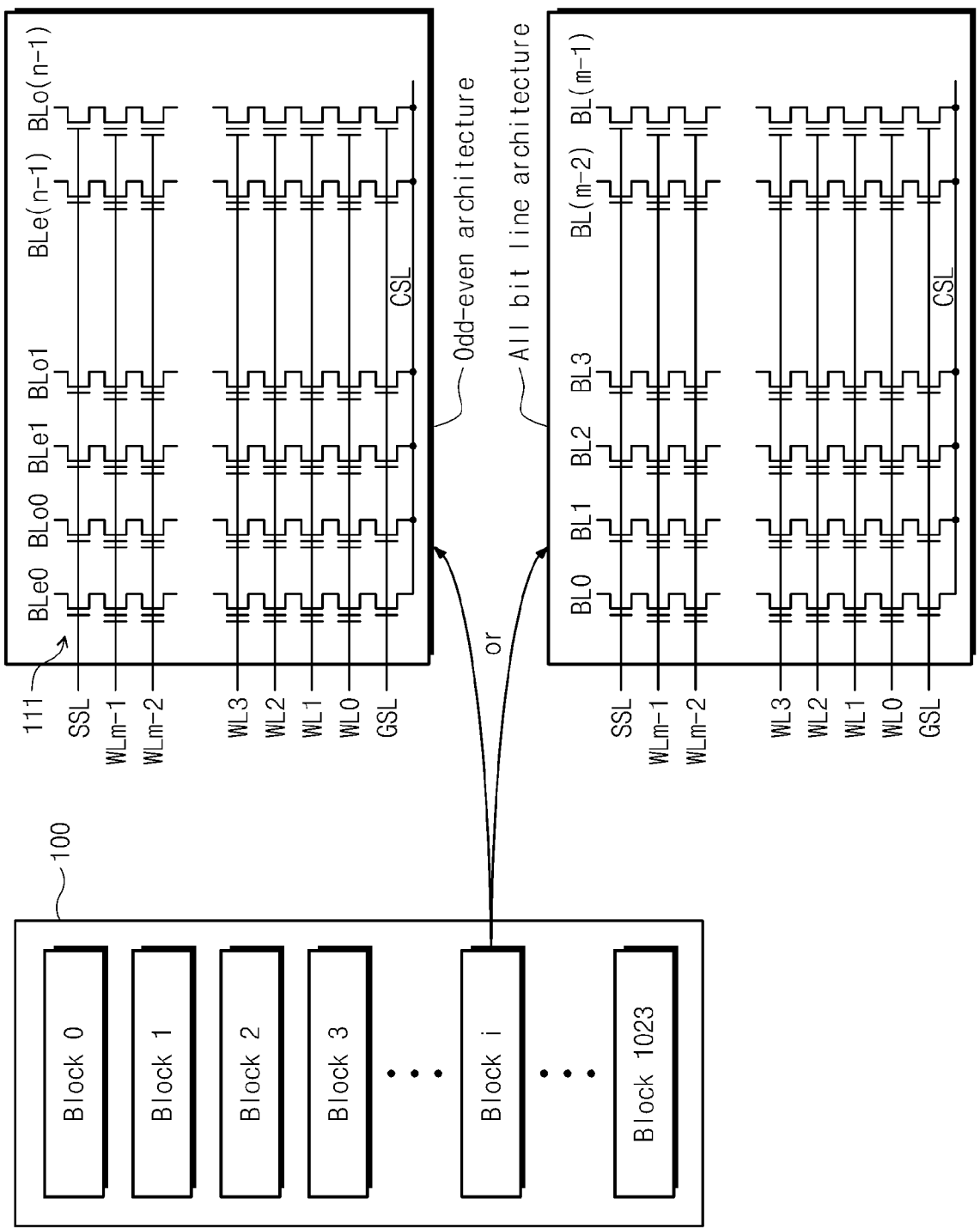
FIG. 3 is a diagram illustrating an example of configuring a memory cell array with memory blocks for all-bit-line (ABL) memory architecture or odd-even memory architecture.

FIG. 3 is a diagram illustrating an example of configuring the memory cell array 100 with memory blocks for the All-Bit-Line (ABL) memory architecture or the odd-even memory architecture. Exemplary structures of the memory cell array 100 will be described with reference to FIG. 3. As an example, a NAND flash memory device having a memory cell array 100 divided into 1024 memory blocks will be described. Data stored in each memory block may be erased simultaneously. In an exemplary embodiment, the memory block is the minimum unit of storage elements that are erased simultaneously. For example, each memory block includes a plurality of columns corresponding respectively to bit lines (e.g., 1 KB bit lines). In an exemplary embodiment called the All-Bit-Line (ABL) architecture, all the bit lines of each memory block may be simultaneously selected in read/program operations. Storage elements, which belong to a common word line and are connected to all bit lines, may be programmed simultaneously.

In an exemplary embodiment, a plurality of storage elements in the same column are connected in series to constitute a NAND string 111. One terminal of the NAND string 111 is connected to a corresponding bit line through a selection transistor controlled by a string selection line SSL, and the other terminal thereof is connected to a common source line CSL through a selection transistor controlled by a ground selection line GSL.

In another exemplary embodiment called the odd-even bit line architecture, bit lines are divided into even bit lines BLe and odd bit lines BLo. In the odd-even bit line architecture, storage elements, which belong to a common word line and are connected to odd bit lines, are programmed in a first time, and storage elements, which belong to a common word line and are connected to even bit lines, are programmed in a second time. Data may be programmed in different blocks and may be read from different blocks. These operations may be performed simultaneously.

Figure 4A:
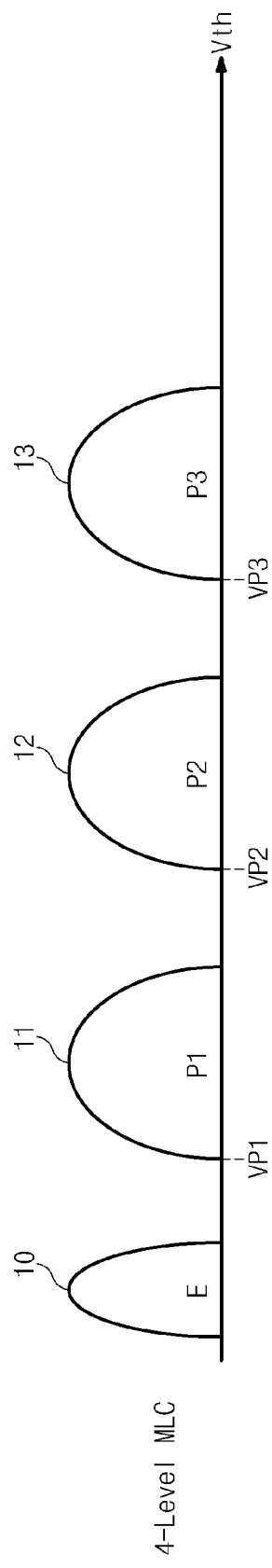
FIGS. 4A to 4C are diagrams illustrating exemplary threshold voltage distributions according to the number of data bits stored in a memory cell.
Figure 4B:
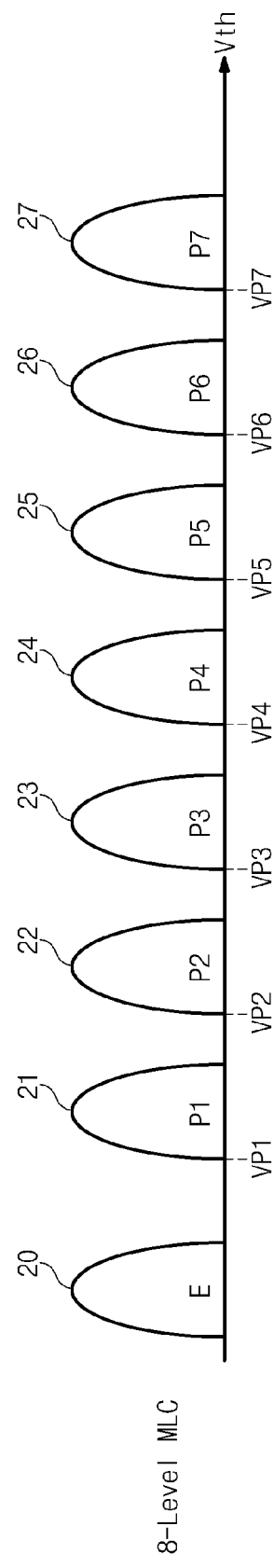
Figure 4C:
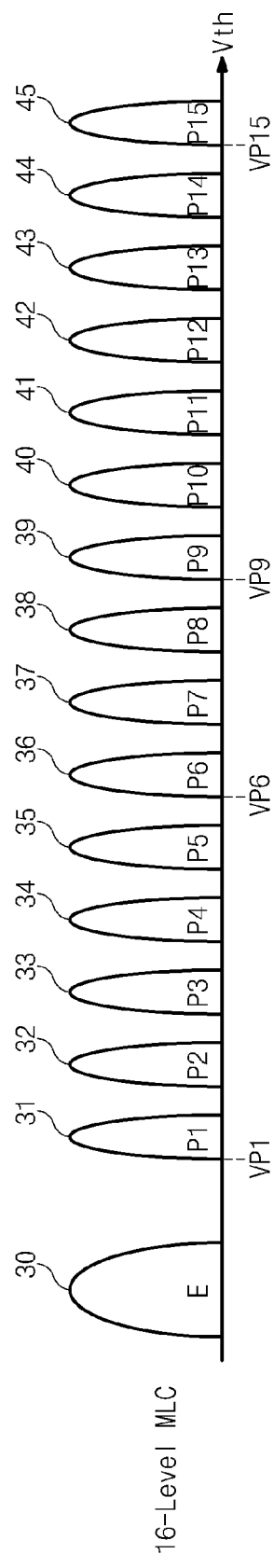

FIGS. 4A to 4C are diagrams illustrating threshold voltage distributions according to the number of data bits stored in a memory cell.

If 2-bit data (or 4-level data/2-page data) are stored in one memory cell, each of the memory cells in a flash memory device has a threshold voltage in one of 4 threshold voltage distributions 10, 11, 12 and 13 as illustrated in FIG. 4A. Herein, the threshold voltage distribution 10 includes threshold voltages of erased memory cells, and the other threshold voltage distributions 11~13 include threshold voltages of programmed memory cells. Voltages VP1, VP2 and VP3 represent verify read voltages for determining whether the memory cells are programmed respectively to the threshold voltage distributions 11~13. Threshold voltages of memory cells in a selected word line are distributed as illustrated in FIG. 4A after 4-level data (or 2-page data) are programmed in the memory cells of the selected word line.

If 3-bit data (or 8-level data/3-page data) are stored in one memory cell, each of the memory cells has a threshold voltage in one of 8 threshold voltage distributions 20~27 as illustrated in FIG. 4B. The threshold voltage distribution 20 includes threshold voltages of erased memory cells, and the other threshold voltage distributions 21~27 include threshold voltages of programmed memory cells. Voltages VP1~VP7 represent verify read voltages for determining whether the memory cells are programmed respectively to the threshold voltage distributions 21~27. Threshold voltages of memory cells in a selected word line are distributed as illustrated in FIG. 4B after 8-level data (or 3-page data) are programmed in the memory cells of the selected word line.

If 4-bit data (or 16-level data/4-page data) are stored in one memory cell, each of memory cells has a threshold voltage in one of 16 threshold voltage distributions 30~45 as illustrated in FIG. 4C. The threshold voltage distribution 30 includes threshold voltages of erased memory cells, and the other threshold voltage distributions 31~45 include threshold voltages of programmed memory cells. Voltages VP1~VP15 represent verify read voltages for determining whether the memory cells are programmed respectively to the threshold voltage distributions 31~45. Threshold voltages of memory cells in a selected word line are distributed as illustrated in FIG. 4C after 16-level data (or 4-page data) are programmed in the memory cells of the selected word line.

FIG. 5 is a diagram illustrating a typical 2-bit soft decision read method.

Referring to FIG. 5, two states Si and Si+1 represented by a solid line are discriminated by a read voltage 101. A read operation performed by the read voltage 101 is referred to as a hard decision read operation. If the states Si and Si+1 change as represented by a dotted line, it is difficult to discriminate the dotted-line states Si and Si+1 by the read voltage 101. As a result, discrimination of the states Si and Si+1 illustrated by a dotted line may be performed through a soft decision read operation. For example, data of a memory cell having a threshold voltage represented by a black dot (•) may be discriminated by a 2-bit soft decision read operation. The 2-bit soft decision read operation includes three sense operations that are successively performed by read voltages 101, 102 and 103. Hard decision data and error probability data may be generated by encoding the data read through the three sense operations. The actual data (i.e., the data that the memory cell actually represents), consequently, may be determined as correct or incorrect according to the error probability data.

Typically, the 2-bit soft decision read operation requires three sense operations as described with reference to FIG. 5.

In an exemplary embodiment, it will be well understood that a method for encoding the data read by the 2-bit soft decision read operation may be implemented variously. The encoding may be performed by the memory controller 2000 or by the read/write circuit 500 of the nonvolatile memory device 1000 under the control of the control logic 400.

Figure 6:
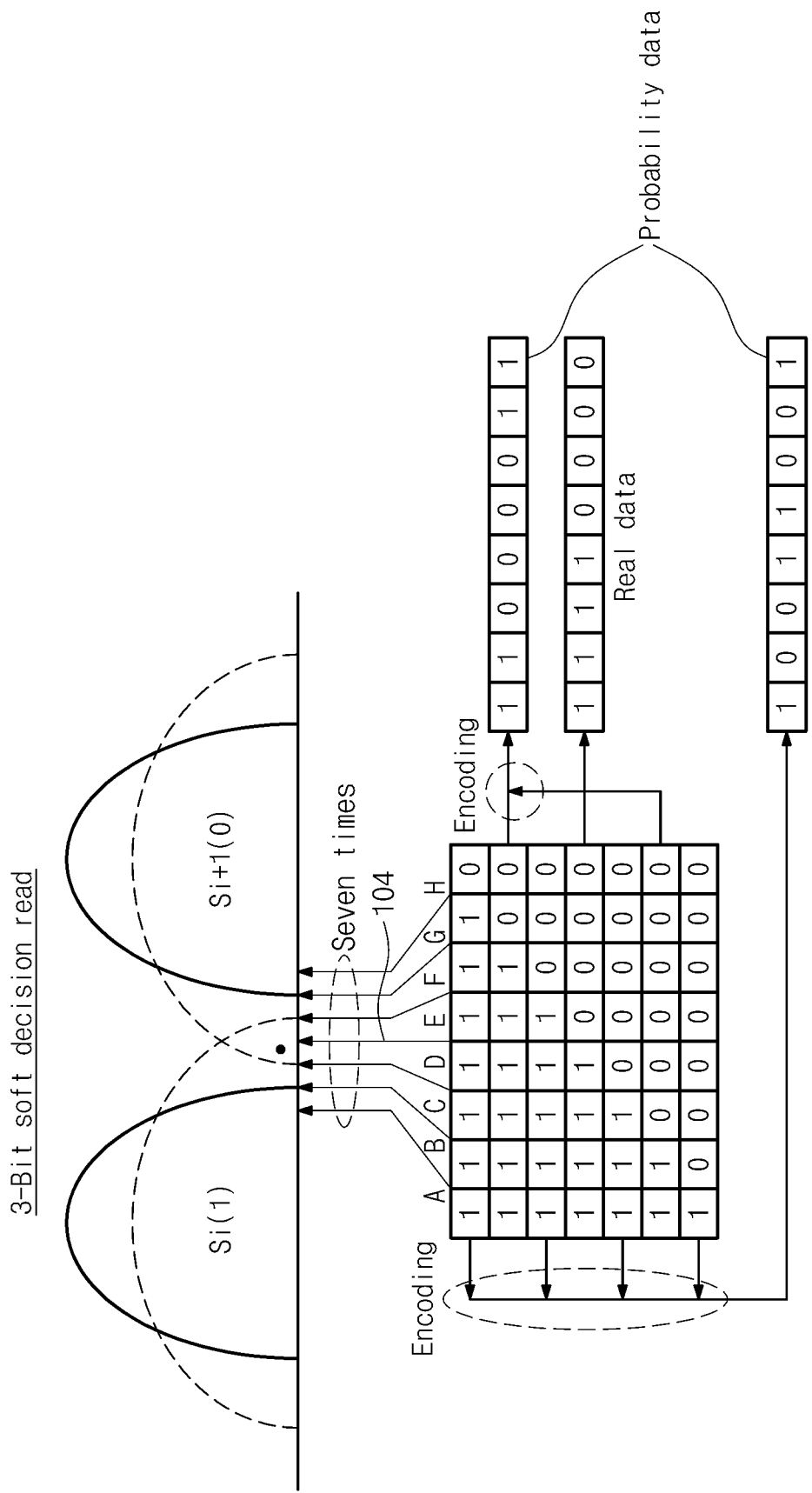
FIG. 6 is a diagram illustrating a typical 3-bit soft decision read method.

FIG. 6 is a diagram illustrating a typical 3-bit soft decision read method.

Referring to FIG. 6, two states Si and Si+1 represented by a solid line are discriminated by a read voltage 104. A read operation performed by the read voltage 104 is referred to as a hard decision read operation. However, if the states Si and Si+1 change as represented by a dotted line, it is difficult to discriminate the states Si and Si+1, illustrated by a dotted line, by the read voltage 104. Discrimination of the states Si and Si+1 illustrated by a dotted line may be performed through a soft decision read operation. For example, data of a memory cell having a threshold voltage represented by a black dot (•) may be discriminated by a 3-bit soft decision read operation. The 3-bit soft decision read operation includes seven sense operations that are performed by seven read voltages. Actual data and error probability data may be generated by encoding the data read through the seven sense operations. The actual data (i.e., the data that the memory cell actually represents), consequently, may be determined as correct or incorrect according to the error probability data.

Typically, the 3-bit soft decision read operation requires seven sense operations as described with reference to FIG. 6.

In an exemplary embodiment, it will be well understood that a method for encoding the data read by the 3-bit soft decision read operation may be implemented variously. The encoding may be performed by the memory controller 2000 or by the read/write circuit 500 of the nonvolatile memory device 1000 under the control of the control logic 400.

Figure 7:
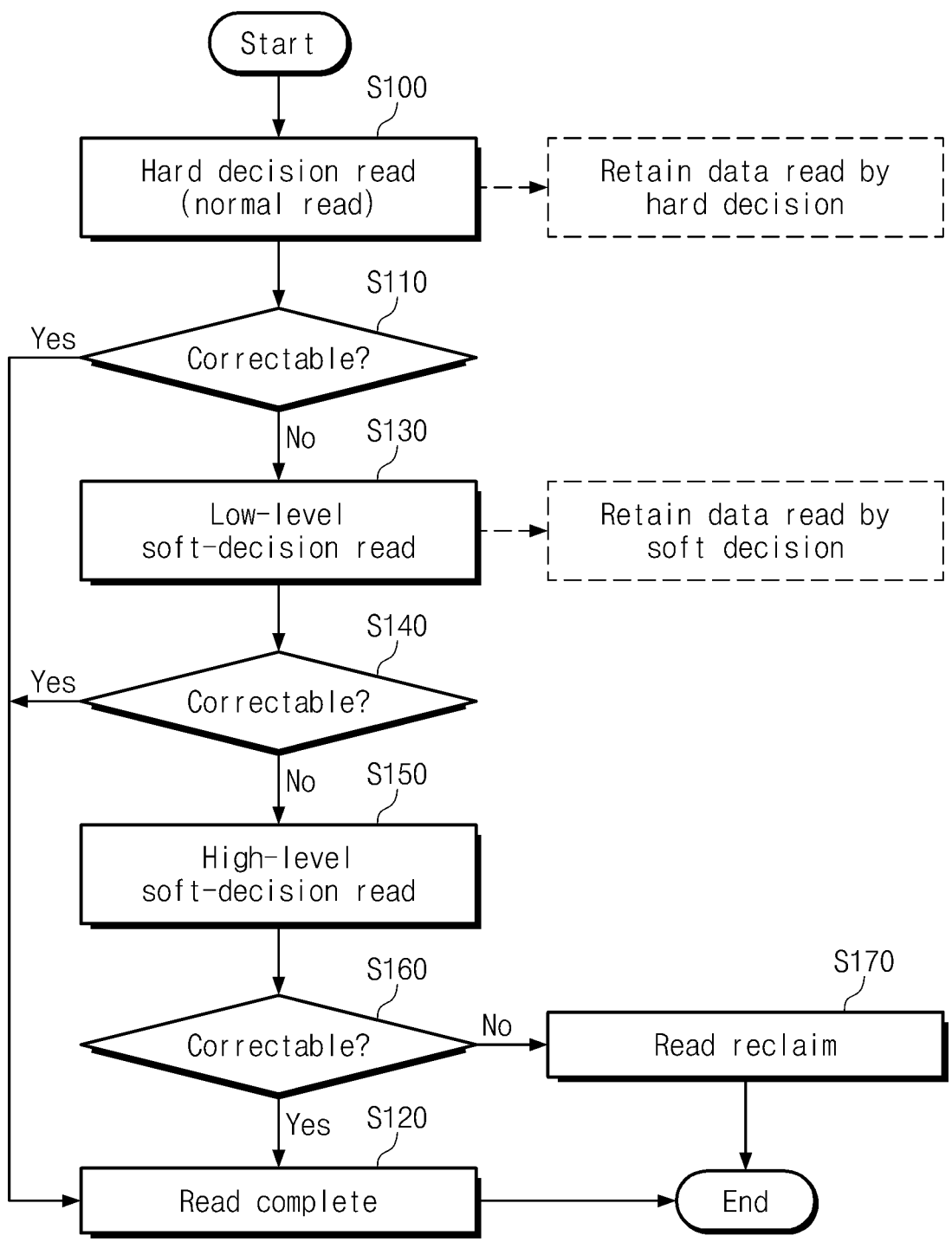
FIG. 7 is a flow chart illustrating a read method of a data storage system according to an exemplary embodiment.
Figure 8:
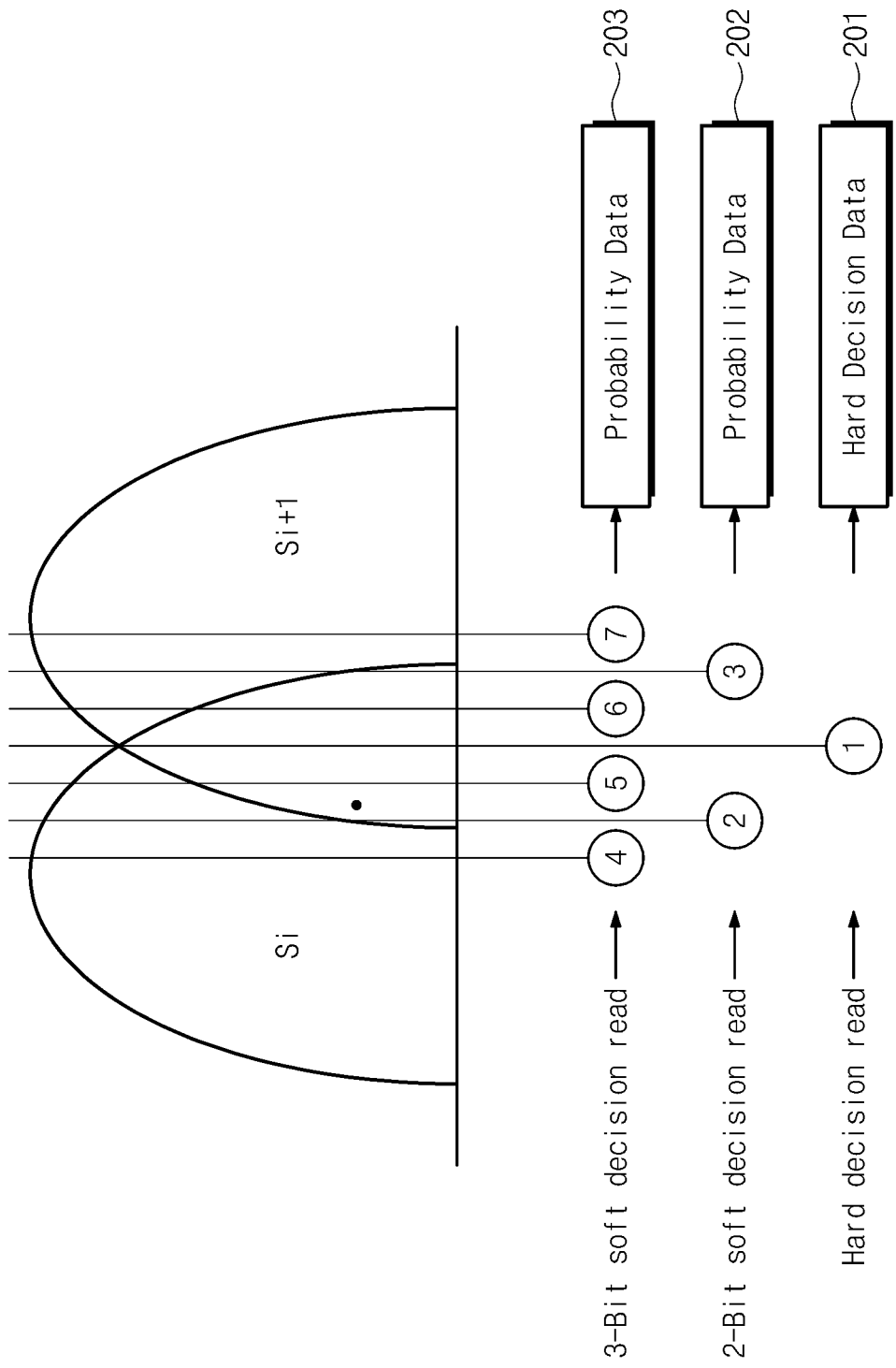
FIG. 8 is a diagram illustrating a process of soft decision read operations controlled by a data storage system according to an exemplary embodiment.

FIG. 7 is a flow chart illustrating a read method of a data storage system according to an exemplary embodiment. FIG. 8 illustrates a process of soft decision read operations controlled by a data storage system according to an exemplary embodiment. Hereinafter, a read method of a data storage system, for example of a nonvolatile memory device in a data storage system according to an exemplary embodiment will be described in detail with reference to the accompanying drawings.

Referring to FIGS. 7 and 8, when a read operation request is received from an external device (e.g., a controller or host outside of the memory controller 2000 and nonvolatile memory device 1000), in step S100, the memory controller 2000 controls the nonvolatile memory device 1000 to perform a normal read operation. In one embodiment, the normal read operation is performed by applying a first set of read voltages (for example, a single voltage or plurality of voltages) to a selected memory cell or selected memory cells, such as in sense operation ① shown in FIG. 8. Data read by the normal read operation are transmitted from the nonvolatile memory device 1000 to the memory controller 2000. The transmitted data are temporarily stored in the buffer memory 2200 of the memory controller 2000. For convenience' sake, a read method of a nonvolatile memory device will be described under the assumption that the read data are erroneous. If no error exists in the read data, the data stored in the buffer memory 2200 are transmitted to the external device. If the read data is erroneous, the ECC unit 2100 determines whether the error in the read data is correctable, in step S110. If the error in the read data is correctable, in step S120, the read operation is completed. That is, the ECC unit 2100 corrects the error in the read data and the memory controller 2000 transmits the error-corrected data to the external device.

If the error in the read data is uncorrectable, the memory controller 2000 controls the nonvolatile memory device 1000 to perform a low-level soft decision read operation, in step S130. In one embodiment, the low-level soft decision read operation is performed by applying a second set of read voltages and none of the voltages in the first set to the selected memory cell or the selected memory cells. In this case, data stored in the buffer memory 2200, i.e., hard decision data are retained and the voltage applied in the hard decision read operation need not be applied. In an exemplary embodiment, the low-level soft decision read operation is different from the 2-bit soft decision read operation described with reference to FIG. 5 in that the low-level soft decision read operation includes only two sense operations. More specifically, the low-level soft decision read operation includes two sense operations ② and ③ as illustrated in FIG. 8. The two sense operations ② and ③ may be performed by applying two different voltages, to the selected memory cell or the selected memory cells without repeating the application of a first voltage applied in sense operation ①. Error probability data 202 are generated on the basis of the data read through the two sense operations ② and ③. The error probability data 202 may be generated in the same way as described above or may be generated differently from the above-described way. The low-level soft decision read operation is performed using the hard decision data resulting from and already previously determined in the hard decision read operation (or the normal read operation) to result in 2-bit soft decision data. Therefore, an additional sense operation performed to obtain the hard decision data is omitted. In step S140, the memory controller 2000 determines whether an error in the low-level soft decision data is correctable. If the error in the low-level soft decision data is correctable, the ECC unit 2100 corrects the error in the low-level soft decision data and the memory controller 2000 transmits the error-corrected data to the external device. That is, the read operation is completed.

If the error in the low-level soft decision data is uncorrectable, the memory controller 2000 controls the nonvolatile memory device 1000 to perform a high-level soft decision read operation, in step S150. In this case, data stored in the buffer memory 2200, i.e., hard decision data 201 and error probability data 202 are retained. In an exemplary embodiment, the high-level soft decision read operation is different from the 3-bit soft decision read operation, described with reference to FIG. 6, in that it includes only 4 sense operations. More specifically, the high-level soft decision read operation includes four sense operations ④, ⑤, ⑥ and ⑦ as illustrated in FIG. 8. The four sense operations ④, ⑤, ⑥ and ⑦ may be performed by applying four different voltages that are different from any of the two voltages applied in the low-level soft decision read operation or the one or more voltages applied in the hard decision read operation, to the selected memory cell or the selected memory cells. Error probability data 203 are generated on the basis of the data read through the four sense operations ④, ⑤, ⑥ and ⑦. The error probability data 203 may be generated in the same way as described above or may be generated differently from the above-described way. The high-level soft decision read operation is performed using the hard decision data 201 resulting from and already previously determined in the hard decision read operation (or the normal read operation) and the error probability data 202 resulting from and already previously determined in the low-level soft decision read operation to result in high-level soft decision data. Therefore, a sense operation performed to obtain the hard decision data and the error probability data 202 is omitted.

In step S160, the memory controller 2000 determines whether an error in the high-level soft decision data is correctable. If the error in the high-level soft decision data is correctable, the read method proceeds to step S120. In step S120, the ECC unit 2100 corrects the error in the high-level soft decision data and the memory controller 2000 transmits the error-corrected data to the external device (e.g., the host). That is, the read operation is completed. If the error in the high-level soft decision data is uncorrectable, in step S170, the read operation requested by the host is treated as fail.

In an exemplary embodiment, it will be well understood that additional soft decision read operations having read resolutions other than the low-level and high-level soft decision read operations may be performed. The additional soft decision read operations may also be performed using the hard decision data already stored and the error probability data determined based on newly applied voltages.

Figure 9:
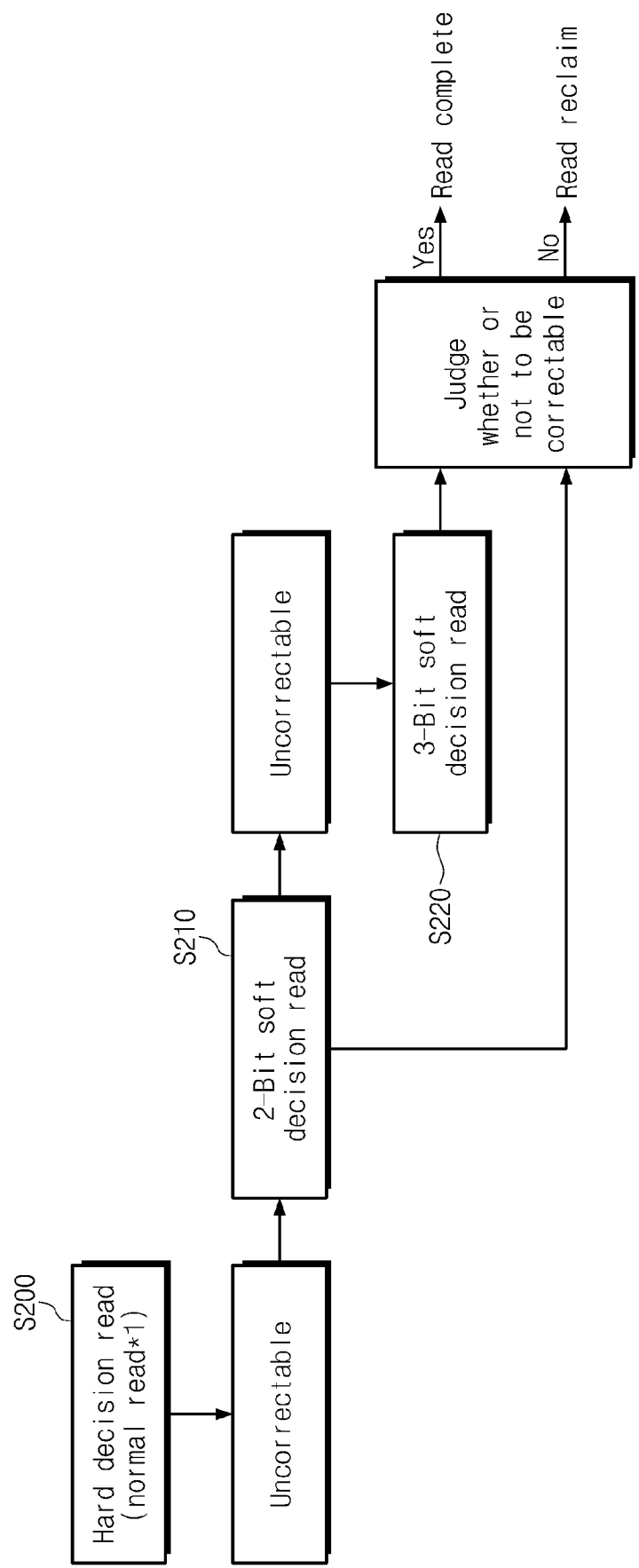
FIG. 9 is a diagram illustrating a read method of a data storage system according to another exemplary embodiment.

FIG. 9 is a diagram illustrating a read method of a data storage system according to another exemplary embodiment.

Except for the following differences, the read method of FIG. 9 is substantially identical to the read method of FIG. 7. In step S200, a hard decision read operation is performed. If hard decision data are uncorrectable, a 2-bit soft decision read operation (or a first soft decision read operation) is performed in step S210. The 2-bit soft decision read operation includes three sense operations that are performed in the same way as described with reference to FIG. 5. Hard decision data and error probability data are generated on the basis of the data read through the three sense operations resulting in 2-bit soft decision data. If an error in the 2-bit soft decision data is uncorrectable by the error probability data, a 3-bit soft decision read operation (or a second soft decision read operation) is performed in step S220. The 3-bit soft decision read operation is performed in substantially the same way as the high-level soft decision read operation described with reference to FIG. 7. That is, four sense operations are performed, and in the 3-bit soft decision read operation, the hard decision data, the error probability data generated through the 2-bit soft decision read operation, and the error probability data generated through the 3-bit soft decision read operation are used. If an error in the hard decision data is correctable, the read operation is completed. If an error in the hard decision data is uncorrectable, the read operation is treated as fail.

Figure 10:
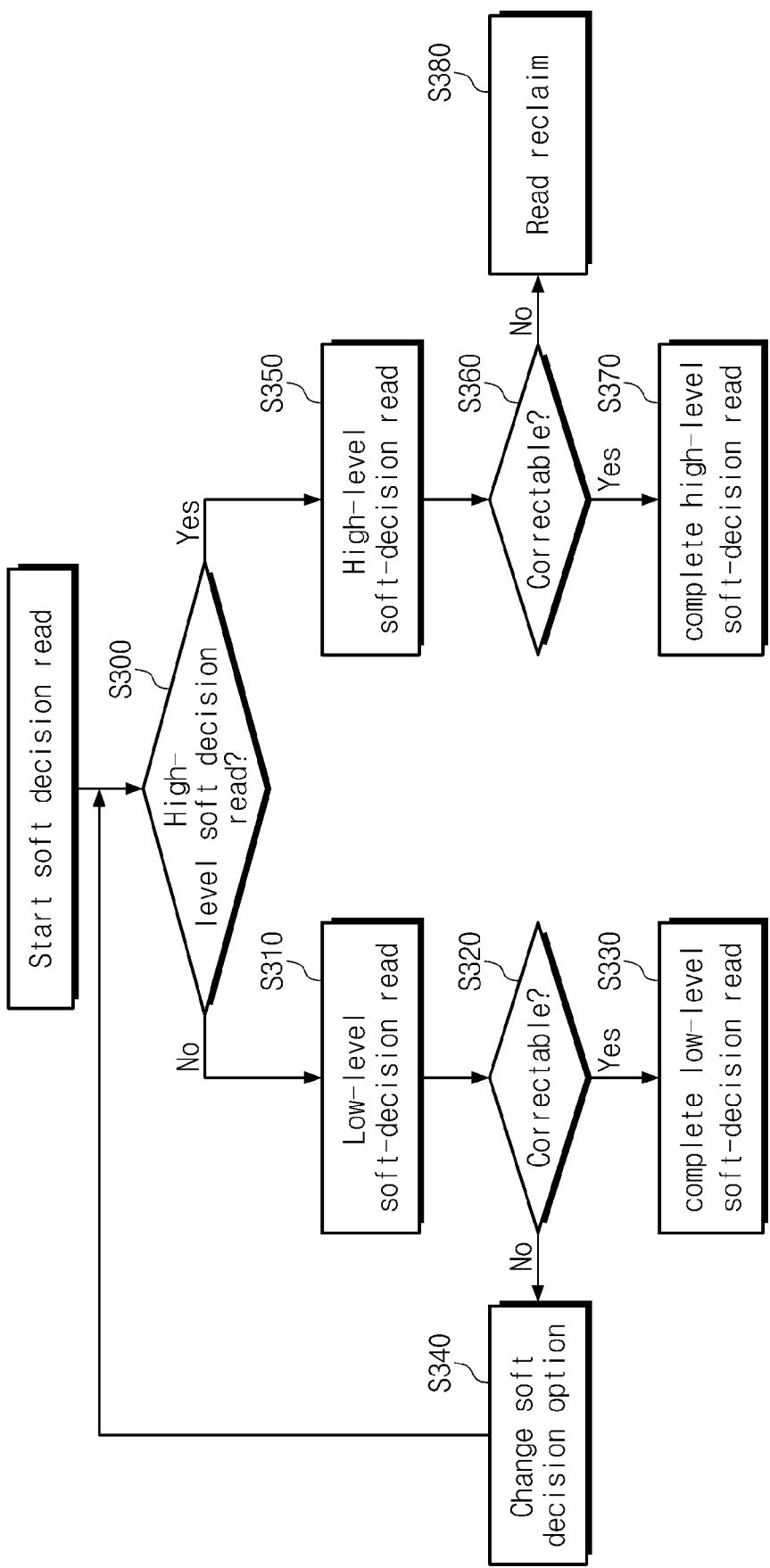
FIG. 10 is a diagram illustrating a read method of a data storage system according to another exemplary embodiment.

FIG. 10 is a diagram illustrating a read method of a data storage system according to another exemplary embodiment.

If an error in data read by a normal read operation is uncorrectable, a read operation is performed as illustrated in FIG. 10.

Referring to FIG. 10, in step S300, it is determined whether a high-level soft decision read operation is selected. If a high-level soft decision read operation is not selected, the read method proceeds to step S310, in which a low-level soft decision read operation is performed in the same way as described with reference to FIG. 5, 7 or 9. In step S320, it is determined whether an error in data read through a normal read operation is correctable. If so, in step S330, the low-level soft decision read operation is completed. If not, the read method proceeds to step S340, in which a soft decision option changes. For example, the soft decision option changes from a low-level soft decision operation to a high-level soft decision operation. That is, a high-level soft decision operation is selected. Thereafter, the read method returns to step S300.

In step S300, it is determined whether a high-level soft decision read operation is selected. Since a high-level soft decision read operation is selected, the read method proceeds to step S350, in which a high-level soft decision read operation is performed in the same way as described with reference to FIG. 6, 7 or 9. In step S360, it is determined whether an error in data read through a normal read operation is correctable. If so, in step S370, the high-level soft decision read operation is completed. If not, in step S380, the read operation is treated as fail.

In an exemplary embodiment, an operation of determining a new read voltage for a hard decision read operation may be performed before the soft decision read operation. For example, the operation of determining the new read voltage may be performed between steps S110 and S130 of FIG. 7 or before step S210 of FIG. 9. A method of determining the new read voltage is disclosed in U.S. Pat. No. 7,542,350 titled "METHODS OF RESTORING DATA IN FLASH MEMORY DEVICES AND RELATED FLASH MEMORY DEVICE MEMORY SYSTEMS", the entirety of which is hereby incorporated by reference.

Flash memory devices are nonvolatile memory devices that can retain data stored therein even when power supply thereto is interrupted. With an increase in the use of mobile devices such as cellular phones, PDAs, digital cameras, portable game consoles and MP3 players, flash memory devices are more widely used not only as data storages but also as code storages. Flash memory devices may also be used in home applications such as HDTV, DVD, router and GPS.

Figure 11:
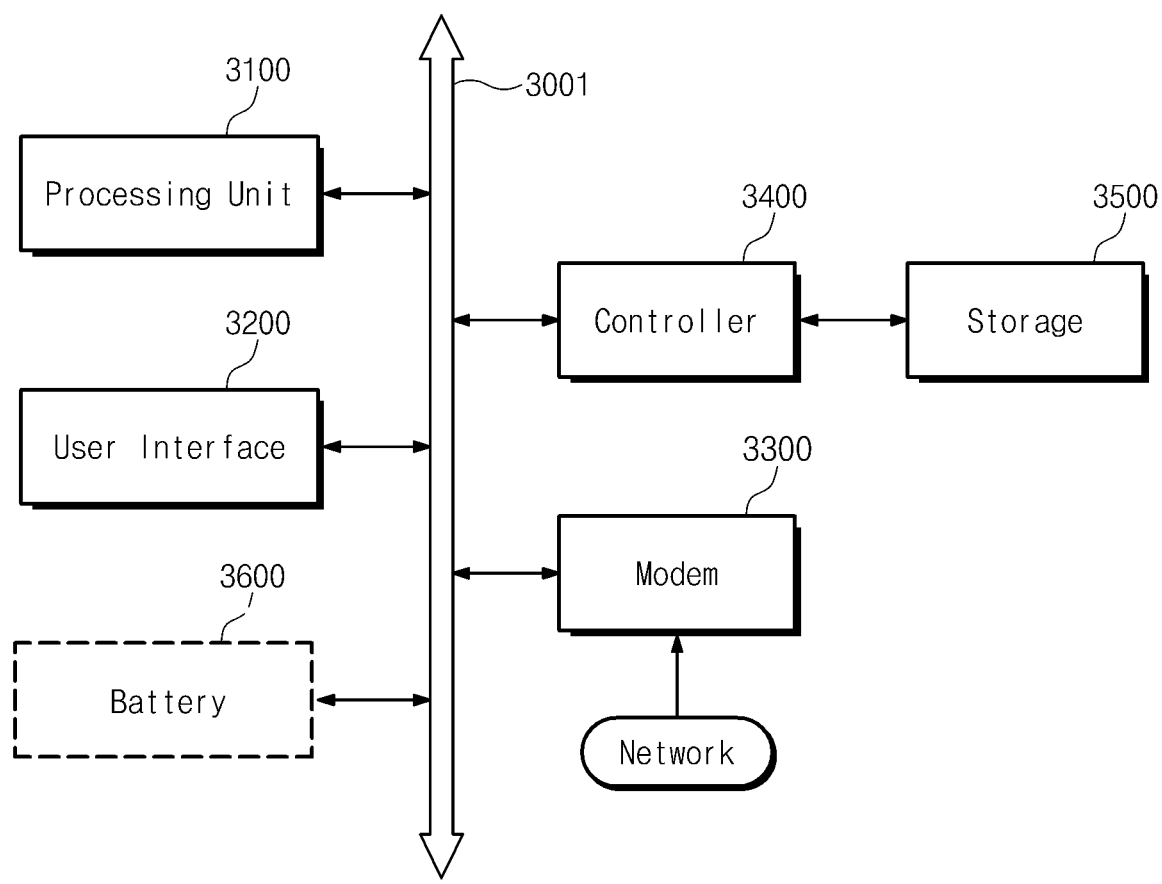
FIG. 11 is a block diagram of a computing system including a nonvolatile memory device and a memory controller according to an exemplary embodiment.

FIG. 11 is a block diagram of a computing system including a nonvolatile memory device and a memory controller according to an exemplary embodiment.

Referring to FIG. 11, a computing system according to an exemplary embodiment includes a processing unit (e.g., a microprocessor) 3100, a user interface 3200, a modem (e.g., a baseband chipset) 3300, a memory controller 3400, and a storage medium (e.g., a nonvolatile memory device) 3500. The elements 3100 to 3400 are electrically connected to a system bus 3001. The nonvolatile memory device 3500 and memory controller 3400 may comprise a data storage system as shown in FIG. 1, and the nonvolatile memory device 3500 may be configured in substantially the same way as illustrated in FIG. 2. The nonvolatile memory device 3500 is controlled by the memory controller 3400 according to the above-described read method, and description thereof is thus omitted. N-bit data (N: an integer equal to or greater than 1), which are or will be processed by the microprocessor 3100, may be stored through the memory controller 3400 in the nonvolatile memory device 3500. If the computing system according to the inventive concept is a mobile device, the computing system may further include a battery 3600 for supplying an operation voltage of the computing system. Although not illustrated in FIG. 11, those skilled in the art will readily understand that the computing system according to the inventive concept may further include an application chipset, a camera image processor, and a mobile DRAM. For example, the memory controller 3400 and the nonvolatile memory device 3500 may constitute a solid state drive/disk (SSD) that uses a nonvolatile memory device to store data.

In an exemplary embodiment, the memory cells may be implemented using variable-resistance memory cells. An exemplary variable-resistance memory cell and a memory device including the same are disclosed in U.S. Pat. No. 7,529,124, the contents of which are hereby incorporated by reference.

In another exemplary embodiment, the memory cells may be implemented using one of various cell structures with a charge storage layer. Examples of the cell structures with a charge storage layer include a charge trap flash structure using a charge trap layer, a stack flash structure with multi-layer stacked arrays, a flash structure without a source/drain, and a pin-type flash structure.

Exemplary memory devices having a charge trap flash structure as a charge storage layer are disclosed in U.S. Pat. No. 6,858,906, U.S. Patent Application Publication No. 2004-0169238 and U.S. Patent Application Publication No. 2006-0180851, the contents of which are hereby incorporated by reference. An exemplary flash structure without a source/drain is disclosed in Korean Patent No. 673020, the contents of which are hereby incorporated by reference.

The flash memory device and/or the memory controller according to the inventive concept may be mounted in various types of packages to implement the data storage system. Examples of the packages of the flash memory device and/or the memory controller include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the exemplary embodiments make it possible to improve the read performance of a data storage system.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A read method for a nonvolatile memory system, comprising:
a first read step including reading a first memory cell of the nonvolatile memory system by applying a first set of read voltages to the first memory cell and performing a first error correction operation;
a second read step including reading the first memory cell by applying a second set of read voltages and none of the voltages in the first set to the first memory cell and performing a second error correction operation when it is determined that the first read step results in an error and cannot be corrected with the first error correction operation; and
when it is determined that the data read in the second read step is in error and cannot be corrected with the second error correction operation, performing a third read step for reading the first memory cell by applying a third set of read voltages and none of the read voltages in the first set or the second set to the first memory cell, and performing a third error correction operation,
wherein the second read step is performed by using a result of the first read step.

2. The read method of claim 1, wherein the first set of read voltages includes at least two read voltages.

3. The read method of claim 1, wherein the first set of read voltages consists of a single read voltage.

4. The read method of claim 3, wherein the second set of read voltages includes a second and a third read voltages, the second read voltage is lower than the single read voltage and the third read voltage is higher than the single read voltage.

5. The read method of claim 4,
wherein the third set of read voltages includes a fourth through a seventh read voltages, the fourth read voltage is lower than the second read voltage, the fifth read voltage is between the second read voltage and the single read voltage, the sixth read voltage is between the single read voltage and the third read voltage, and the seventh read voltage is higher than the third read voltage.

6. The read method of claim 1, wherein the third read step is performed by using a result of the first and second read steps.

7. The read method of claim 1, wherein the first read step and second read step include reading a plurality of memory cells of a selected page of memory cells at the same time as reading the first memory cell.

8. A read method for a nonvolatile memory system, comprising:
a hard decision read step including reading a first memory cell of the nonvolatile memory system by applying a first voltage to the first memory cell and performing a first error correction operation;
a first soft decision read step including reading the first memory cell by applying a first set of read voltages to the first memory cell and performing a second error correction operation when it is determined that the hard decision read step results in an error and cannot be corrected with the first error correction operation; and
a second soft decision read step including reading the first memory cell by applying a second set of read voltages and none of the voltages in the first set to the first memory cell and performing a third error correction operation when it is determined that the first soft decision read step results in an error and cannot be corrected with the second error correction operation,
wherein the second soft decision read step is performed by using a result of the first soft decision read step,
wherein the first set of read voltages includes a second and a third read voltages, the second read voltage is lower than the first voltage and the third read voltage is higher than the first voltage, and
wherein the second set of read voltages includes a fourth through a seventh read voltages, the fourth read voltage is lower than the second read voltage, the fifth read voltage is between the second read voltage and the first read voltage, the sixth read voltage is between the first read voltage and the third read voltage, and the seventh read voltage is higher than the third read voltage.

9. The read method of claim 8, wherein the first soft decision read step is performed by using a result of the hard decision read step.

10. The read method of claim 8, wherein the hard decision, first soft decision and second soft decision read steps include reading a plurality of memory cells of a selected page of memory cells at the same time as reading the first memory cell.

11. A nonvolatile memory system comprising:
a nonvolatile memory device having a plurality of memory cells arranged in rows and columns; and
a controller configured to control the nonvolatile memory device and perform a hard decision read step, a first soft decision read step and a second soft decision read step,
wherein the hard decision read step includes reading a first memory cell of the plurality of memory cells by applying a first voltage to the first memory cell and performing a first error correction operation,
wherein the first soft decision read step includes reading the first memory cell by applying a first set of read voltages to the first memory cell and performing a second error correction operation when it is determined that the hard decision read step results in an error and cannot be corrected with the first error correction operation,
wherein the second soft decision read step includes reading the first memory cell by applying a second set of read voltages and none of the voltages in the first set to the first memory cell and performing a third error correction operation when it is determined that the first soft decision read step results in an error and cannot be corrected with the second error correction operation,
wherein the first soft decision read step includes using a result of the hard decision read step,
wherein the first set of read voltages includes a second and a third read voltages, the second read voltage is lower than the first voltage and the third read voltage is higher than the first voltage, and
wherein the second set of read voltages includes a fourth through a seventh read voltages, the fourth read voltage is lower than the second read voltage, the fifth read voltage is between the second read voltage and the first read voltage, the sixth read voltage is between the first read voltage and the third read voltage, and the seventh read voltage is higher than the third read voltage.

12. The nonvolatile memory system of claim 11, wherein the data resulting from the hard decision read step and the first soft decision read step are stored in a buffer of the controller.

13. The nonvolatile memory system of claim 11, wherein the nonvolatile memory device and the controller comprise one of a memory card and a solid state disk.

14. A read method for a nonvolatile memory system, comprising:
a first read step including reading a first memory cell of the nonvolatile memory system by applying a first set of read voltages to the first memory cell and performing a first error correction operation;
a second read step including reading the first memory cell by applying a second set of read voltages and none of the voltages in the first set to the first memory cell and performing a second error correction operation when it is determined that the first read step results in an error and cannot be corrected with the first error correction operation; and
when it is determined that the data read in the second read step is in error and cannot be corrected with the second error correction operation, performing a third read step for reading the first memory cell by applying a third set of read voltages and none of the read voltages in the first set or the second set to the first memory cell and performing a third error correction operation,
wherein the third read step is performed by using a result of the first read step and the second read step.

* * * * *